(12) United States Patent
Seefeldt et al.

(10) Patent No.: US 8,451,062 B2
(45) Date of Patent: May 28, 2013

(54) RADIATION HARDENED DIFFERENTIAL AMPLIFIER

(75) Inventors: James D. Seefeldt, Eden Prairie, MN (US); Keith Golke, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 9 days.

(21) Appl. No.: 13/190,285

(22) Filed: Jul. 25, 2011

(65) Prior Publication Data

US 2013/0027137 A1 Jan. 31, 2013

(51) Int. Cl.
*H03F 3/68* (2006.01)

(52) U.S. Cl.
USPC .................................. 330/295; 330/124 R

(58) Field of Classification Search
USPC ................... 330/295, 124 R, 84, 126
See application file for complete search history.

(56) References Cited

U.S. PATENT DOCUMENTS

| | | | | |
|---|---|---|---|---|
| 3,477,031 | A * | 11/1969 | Nagata | 330/253 |
| 4,395,687 | A * | 7/1983 | Belohoubek | 333/164 |
| 4,468,626 | A * | 8/1984 | Swanson | 330/10 |
| 5,148,121 | A * | 9/1992 | Uchida | 330/295 |
| 5,307,142 | A | 4/1994 | Corbett et al. | |
| 5,418,473 | A | 5/1995 | Canaris | |
| 5,796,306 | A * | 8/1998 | Tsumura | 330/124 R |
| 6,111,780 | A | 8/2000 | Bertin | |
| 6,208,554 | B1 | 3/2001 | Phan et al. | |
| 6,259,643 | B1 | 7/2001 | Li | |
| 6,278,287 | B1 | 8/2001 | Baze | |
| 6,282,140 | B1 | 8/2001 | Phan et al. | |
| 6,487,134 | B2 | 11/2002 | Thoma et al. | |
| 6,525,590 | B2 | 2/2003 | Swonger | |
| 6,549,443 | B1 | 4/2003 | Jensen et al. | |
| 7,119,621 | B2 * | 10/2006 | Chen et al. | 330/295 |
| 7,362,154 | B2 | 4/2008 | Mo | |
| 7,679,403 | B2 | 3/2010 | Erstad | |
| 7,834,686 | B2 * | 11/2010 | Staszewski et al. | 330/51 |

FOREIGN PATENT DOCUMENTS

CN 101572547 A 11/2009

OTHER PUBLICATIONS

Rathod et al., "A Low-Noise, Porcess-Variation-Tolerant Double-Gate FinFET Based Sense Amplifier," Microelectronics Reliability 51 (2011) 773-780.

Zarandi et al., "A SEU-Protected Cache Memory-Based on Variable Associativity of Sets," Reliability Engineering and System Safety 92 (2007) 1587-1596.

* cited by examiner

*Primary Examiner* — Henry Choe
(74) *Attorney, Agent, or Firm* — Shumaker & Sieffert, P.A.

(57) ABSTRACT

This disclosure is directed to techniques for preventing or reducing perturbations of an output signal of a differential amplifier caused by ionizing radiation incident upon the amplifier. The amplifier may include an amplification module that includes a plurality of amplification units configured to amplify a difference between a first component and a second component of a differential voltage signal to generate a plurality of amplified difference signals each corresponding to the amplified difference. The amplifier may further include a combination module that combines the plurality of amplified difference signals to generate a common output signal corresponding to the amplified difference.

18 Claims, 12 Drawing Sheets

RADIATION HARDENED DIFFERENTIAL AMPLIFIER

STATEMENT REGARDING FEDERALLY SPONSORED RESEARCH OR DEVELOPMENT

This invention was made with Government support under Government Contract #PO 02ESM162076. The Government has certain rights in the invention.

TECHNICAL FIELD

This disclosure relates generally to electrical circuits and, more specifically, to electrical circuits protected from the effects of radiation.

BACKGROUND

Low-power analog circuits, including low-power analog amplifiers, may be susceptible to ionizing radiation, such as heavy ions, protons, or neutrons. Such ionizing radiation may have terrestrial origins, e.g., nuclear reactions, particle accelerators, and thermo-nuclear explosions, as well as extraterrestrial origins, e.g., cosmic rays. In some cases, such ionizing radiation may occur in the form of isolated transient events rather than occurring in a continuous manner. This form of ionizing radiation may be referred to as single event transient radiation (SETR). In some circumstances, SETR may cause a low-power analog amplifier to experience one or more single event upsets (SEUs), which may cause the amplifier to operate undesirably. For example, in some cases, an SEU may cause voltage and/or current level perturbations on one or more outputs of the amplifier, causing the one or more outputs to temporarily deviate from intended output levels. Although the SEU may only temporarily affect the output levels of the amplifier, in some cases, such perturbations may propagate to other devices and components of a circuit including the amplifier, which may result in the circuit operating out of specification.

SUMMARY

This disclosure is directed to techniques for preventing or reducing perturbations of an output signal of a differential amplifier caused by ionizing radiation incident upon the amplifier. According to these techniques, the amplifier may include an amplification module that includes a plurality of amplification units. The amplification units may each be configured to receive a differential voltage signal comprising a first and a second component. The amplification units may each be further configured to determine and amplify a difference between the first component and the second component of the differential voltage signal to generate a plurality of amplified difference signals that each correspond to the amplified difference. The amplifier may further include a combination module. The combination module may be configured to combine the amplified difference signals from the amplification units to generate a common output signal that corresponds to the amplified difference.

According to one example, a method of amplifying a differential voltage signal is described herein. The method includes receiving, by each of a plurality of amplification units, a differential voltage signal comprising a first component and a second component. The method further includes determining, via each of the plurality of amplification units, a difference between the first component and the second component of the differential voltage signal. The method further includes amplifying, via each of the plurality of amplification units, the difference between the first component and the second component of the differential voltage signal to generate a plurality of amplified difference signals that each correspond to the amplified difference. The method further includes combining the plurality of amplified difference signals to generate a common output signal that corresponds to the amplified difference, and outputting the common output signal.

According to another example, a differential amplifier is described herein. The amplifier includes an amplification module including a plurality of amplification units configured to amplify a difference between a first component and a second component of a differential voltage signal to generate a plurality of amplified difference signals that each correspond to the amplified difference. The amplifier further includes a combination module configured to combine the plurality of amplified difference signals to generate a common output signal that corresponds to the amplified difference.

According to still another example, a device for amplifying a differential voltage signal is described herein. The device includes means for receiving, by each of a plurality of amplification units, a differential voltage signal comprising a first component and a second component. The device further includes means for determining, by each of the plurality of amplification units, a difference between the first component and the second component of the differential voltage signal. The device further includes means for amplifying, by each of the plurality of amplification units, the difference between the first component and the second component of the differential voltage signal to generate a plurality of amplified difference signals that each correspond to the amplified difference. The device further includes means for combining the plurality of amplified difference signals to generate a common output signal that corresponds to the amplified difference, and means for outputting the common output signal.

The differential amplifier described herein may advantageously reduce or eliminate an impact of ionizing radiation incident upon the amplifier. For example, consistent with the techniques of this disclosure, by amplifying the differential voltage signal by each of the plurality of amplification units to generate the plurality of amplified difference signals, and by combining the plurality of amplified difference signals by the combination module to generate the common output signal, impact on the common output signal of perturbations of amplified difference signals of one or more of the amplification units caused by ionizing radiation incident upon the units may be mitigated. For example, the impact may be mitigated by combining the amplified difference signals with amplified difference signals of amplification units unaffected by the ionizing radiation to generate the common output signal.

The details of one or more examples described herein are set forth in the accompanying drawings and the description below. Other features, objects, and advantages of the techniques described herein will be apparent from the description and drawings, and from the claims.

DETAILED DESCRIPTION

Figure 1:
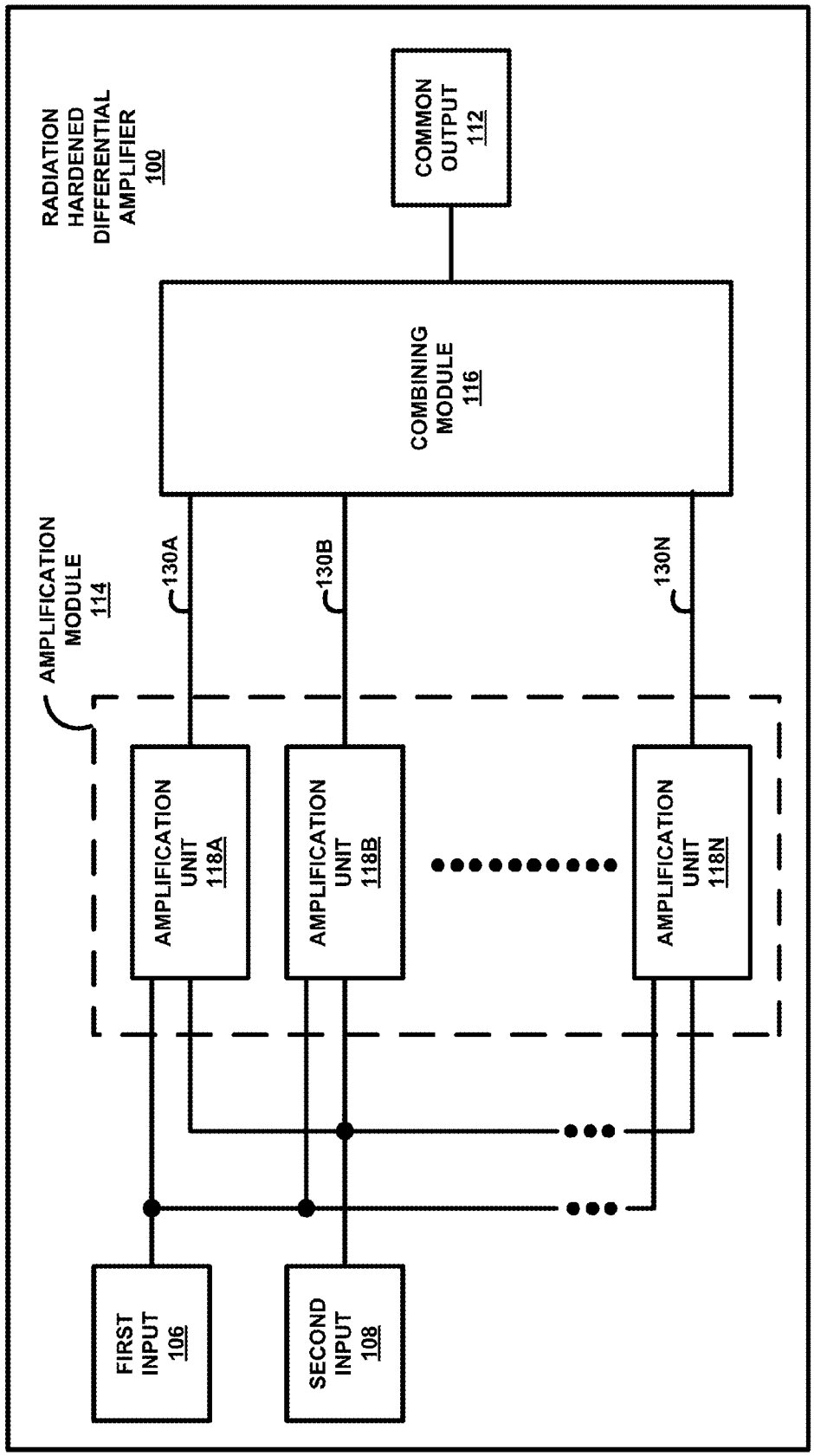
FIG. 1 is a block diagram that illustrates one example of a radiation-hardened differential amplifier consistent with the techniques of this disclosure.

FIG. 1 is a block diagram that illustrates one example of a radiation-hardened differential amplifier consistent with the techniques of this disclosure. As depicted in FIG. 1, amplifier 100 includes an amplification module 114 and a combination module 116. Amplification module 114 may amplify a difference between a first component and a second component of a differential voltage signal to generate a plurality of amplified difference signals 130A-130B that each correspond to the amplified difference. Combination module 116 may combine the plurality of amplified difference signals to generate a common output signal 112 that corresponds to the amplified difference.

For example, as depicted in FIG. 1, amplification module 114 includes a plurality of amplification units 118A-118N. According to the techniques of this disclosure, the plurality of amplification units 118A-118N may comprise at least two amplification units 118A, 118B. In other example, as indicated by the dotted line between amplification units 118B and 118N depicted in FIG. 1, amplification module 114 may include any number N of amplification units 118A-118N.

As depicted in FIG. 1, amplification module 114 includes a first input 106 and a second input 108. According to the techniques described herein, amplification units 118A-118N may each receive a differential signal via first input 106 and second input of amplification module 114. For example, each of amplification units 118A-118N may each receive a first component of a differential signal via first input 106, and receive a second component of the differential signal at second input 108.

According to the example of FIG. 1, each amplification unit 118A-118N of amplification module 114 may determine a difference between the first and second components of a differential received via first input 106 and second input 108, respectively, and amplify the determined difference between the first and second components of the differential signal to each generate a respective amplified difference signal 130A-130N. As shown in FIG. 1, each amplification unit 118A-118N may supply the respective amplified difference signal 130A-130N to combination module 116 of differential amplified 100.

In this manner, amplification module 114 may send, via the plurality of amplification units 118A-118N depicted in FIG. 1, a plurality of amplified difference signals 130A-130N.

Combination module 116 may operate to receive the plurality of amplified difference signals 130A-130N, and combine the received plurality of amplified difference to generate a common output signal 112. Combination mode 116 may comprise, for example a common signal node that the plurality of amplified difference signals 130A-130N are coupled to. In other examples, combination module 116 may comprise one or more circuit components or circuits configured to receive and combine the plurality of amplified difference signals 130A-130N.

In this manner, amplifier 100 may be more resilient, relative to other amplifier circuits, when exposed to an incident heavy ion or particle. For example, according to the techniques of this disclosure, an incident heavy ion or particle that strikes one or more of amplification units 118A-118N in a common output signal 112 generated combination module 116. As such, amplifier 100, and/or one or more other circuits coupled to amplified 100, may continue to operate as expected if affected by a heavy ion or particle strike.

In some cases, amplifier 100 may operate in environments that cause exposure of amplifier 100 to ionizing radiation, such as heavy ions, protons, or neutrons. For example, amplifier 100 may operate in outer space, on-board aircraft (e.g., military, commercial, and/or personal aircraft), or in land-based applications.

For example, amplifier 100 may operate in environments within close proximity to a nuclear reaction, a particle accelerator, or a site of a nuclear explosion where ionizing radiation is more likely. In other examples, amplifier 100 may operate in other environments where ionizing radiation may effect one or more components of amplifier 100, such as may be experienced by a commercial, military, industrial, or personal aircraft operating in the Earth's atmosphere.

In all these cases, ionizing radiation may occur in the form of isolated transient events rather than occurring in a continuous manner, and may be referred to as single event transient radiation (SETR). In some circumstances, SETR may cause one or more of amplification units 118A-118N to experience one or more single event upsets (SEUs), which may cause an affected amplification unit 118A-118N and/or driver unit 124A-124N to operate undesirably.

For example, in some cases, the SEUs may cause one or more components (e.g., transistors), of amplification unit 118A-118N to conduct more or less current than the transistors are configured to conduct as biased within amplifier 100. For example, if one or more transistors of one of amplification units 118A-118N experience a particle strike as described above one or more of amplified difference signals 130A-130N may temporarily deviate from an intended output level.

According to some techniques, amplifier 100 may be enclosed in material that acts to shield SETR. For example, amplifier 100 may comprise an integrated circuit that includes packaging configured to shield some or all of SETR incident upon amplifier 100. In some examples, however, enclosing amplifier 100 as described may be cost-ineffective, or impractical. For example, enclosing amplifier 100 using the above-described techniques may require costly shielding materials and manufacturing processes. Additionally, enclosing amplifier 100 as described may limit or restrict access to the inputs and outputs (i.e., positive power supply 102, negative power supply 104, first input 106, second input 108, bias current input 110, and output 112) of amplifier 100, making use of amplifier 100 impractical. In addition, in some examples, even if amplifier 100 is enclosed in a material or packaging configured to shield against SETR, such a material or packaging may not prevent all SETR from affecting operation of amplifier 100.

The techniques of this disclosure are premised on observations that indicate that ionizing radiation generally occurs in the form of SETR, rather than occurring in a continuous manner, as previously described. Because SETR is characterized as ionizing radiation occurring in the form of isolated transient events, effects of SETR, e.g., SEUs, on circuits are generally limited both temporally and spatially. In other words, as a result of SETR, a differential amplifier may experience an SEU for a limited duration of time and in limited physical locations of the amplifier. The techniques of this disclosure may take advantage of this phenomenon to improve operation of differential amplifiers in environments that include ionizing radiation.

In particular, consistent with the above-described observations, radiation hardened differential amplified 100 depicted in FIG. 1 is specifically configured to reduce an affect that SETR may have on operation of differential amplifier 100. For example, it may be unlikely that, due to a physical arrangement of one or more components of amplification units 118A-118N, that more than one of amplification units 118A-118N may experience an SEU that perturbs operation of the effected amplification unit 118A-118N. It may further be even less likely that three of amplification units 118A-118N experience such an SEU, and even less likely that four or more of amplification units 118A-118N will experience such an SEU.

As such, because amplifier 100 comprises a plurality of amplification units 118A-118N, it may be very unlikely that more than one of amplification units 118A-118N will experience an SEU at a given time as a result of SETR incident upon amplifier 100. Because the respective plurality of amplified difference signals 130A-130N generated by the respective amplification units 118A-118N are combined by combination module 116 as a common output signal 112, the common output signal 112 may be less susceptible to SETR than other differential amplifiers.

Specifically, the effect of the perturbations may be prevented or reduced in comparison to other differential amplifiers, because one or more of amplified difference signals 130A-130N that may be perturbed as a result of an SEU may be combined with other, unperturbed amplified difference signals 130A-130N that are unaffected by SETR. Thus, even in the event that more than one of amplification units 118A-118N of amplifier 100 experiences an SEU at a given time, the effect of the resulting perturbations on the common output signal of output 112 of differential amplifier 100 may be prevented or reduced.

As a result, common output signal 118 may remain unaffected, or be less affected, by the SEU experienced by the one or more of amplification units 118A-118N. In other words, as a result of one or more amplification units 118A-118N experiencing an SEU caused by SETR incident upon the units, common output signal 112 may not deviate from intended output levels, or may deviate from the intended output levels to a lesser degree than one or more perturbed amplified difference signal 130A-130N generated by one of the one or more of amplification units 118A-118N.

Figure 2:
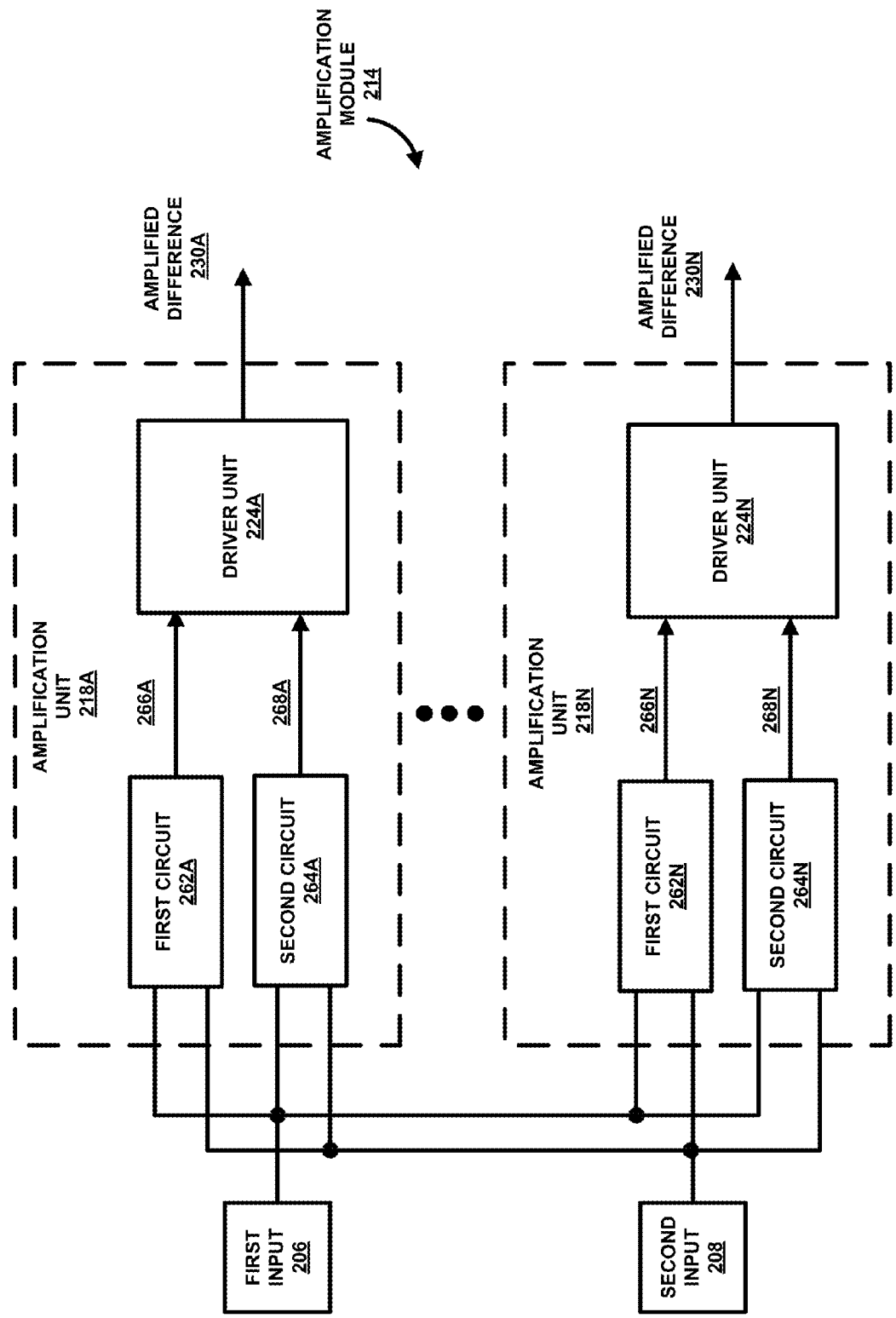
FIG. 2 is a block diagram of one example of an amplification module that includes a plurality of amplification units consistent with the techniques of this disclosure.

FIG. 2 is a block diagram that illustrates one example of an amplification module 214 that includes a plurality of amplification units 218A-218N consistent with the techniques described herein. As shown in the example of FIG. 2, amplification module 214 includes a plurality of amplification units 218A-218N that each include a first amplification circuit (first circuit) 262A-262N, a second amplification circuit (second circuit) 264A-264N, and a driver unit 224A-224N. The example of FIG. 2 is provided for exemplary purposes only. In other examples, amplification units may not each include a first and second amplification circuits as depicted in FIG. 2. Instead, according to these examples, each of a plurality of amplification units (e.g., amplification units 118A-118N depicted in FIG. 1 may only include one of first amplification circuit 262A-262N or second amplification circuit 264A-264N. According to these other examples, the plurality of amplification units 218A-218N may or may not include a corresponding plurality of driver units 224A-224N as depicted in FIG. 2.

According to the example of FIG. 2, each of the plurality of amplification units 218A-218N is configured to receive a first component of a differential signal via first input 206, and a second component of the differential signal via second input 206. Generally speaking, each of amplification units 218A-218N may be configured to generate, based on the received first and second components of the differential input signal, an amplified difference signal that corresponds to a difference between the first and second components of the differential signal received at first and second inputs 206, 208, respectively.

According to the example of FIG. 2, each of amplification units 218A-218N includes first circuit 262A-262N and second circuit 264A-264N. According to this example, each of the respective first circuit 262A-262N and second circuit 264A-264N may independently determine a difference between and amplify the received first and second components of the differential input signal to generate a respective output signal. For example, first circuits 262A-262N may each receive the first and second components of the differential input signal, and generate a first circuit output signal 266A-266N that corresponds to the determined and amplified difference between the first and second components, and output the first output signal 266A-266N to a respective driver unit 224A-224N of the respective amplification unit 218A-218N. Second circuits 264A-264N may also each receive the first and second components of the differential input signal, and generate a second circuit output signal 268A-268N.

Each driver unit 224A-224N of the respective amplification units 218A-218N may each receive the first circuit output signal 266A-266N and second circuit output signal 268A-268N from the respective first and second circuits 262A-262N and 264A-264N and combine the received signals to generate a plurality of amplified difference signal 230A-230N of the respective amplification units 218A-218N.

In some examples, although not shown in FIG. 2, in some examples as described above with respect to the example of FIG. 1, such a plurality of amplified difference signals 230A-230N of the respective amplification units 218A-218N depicted in FIG. 2 may be output to a combination module (e.g., combination module 116 depicted in FIG. 1). Such a combination module may combine the plurality of amplified difference signals received from the respective amplification units 218A-218N to generate a common output signal (e.g., common output signal 112 depicted in FIG. 1) that corresponds to the difference between the received first and second components of the differential signal. In this manner, as described above, a differential amplifier that includes an amplification module 214 as depicted in FIG. 2 may operate with improved resilience to SETR, as described above.

As also described above, in some examples, a plurality of amplification units as described herein may not each include first and second amplification circuits as shown in FIG. 2.

Instead, according to such examples, each amplification units may only include one of the first or second circuit 262A-262N and 264A-264N depicted in FIG. 2.

In some examples, each of the respective first circuits 262A-262N may be configured to determine a difference between received first and second components of a difference signal for a first range of values of the first and second components of the differential signal, and each of the respective second circuit 264A-264N may be configured to determine a difference between the first and second components of the differential signal for a second range of values of the first and second components.

According to these examples, it may be beneficial to utilize the amplification units 218A-218N depicted in FIG. 2, which each include respective first and second amplification circuits 262A-262N and 264A-264N, because an input range for which amplification module 214 may amplify a determined difference may be increased in comparison to other techniques such as where each of amplification units 218A-218N only include one of first amplification circuit 262A-262N or second amplification circuit 264A-264N In some examples, the amplification module 114 depicted in FIG. 2 may be further advantageous, because not only do amplification module 114 include a plurality of first and second circuits 262A-262N and 264A-264N that each determine a difference between first and second components of a differential input signal and amplify the difference, amplification module 114 also includes a plurality of driver units 224A-224N that receive an output from each of the respective first and second circuits 262A-262N and 264A-264N and generate an amplified difference signal of the respective amplification unit 218A-218N.

In some examples, a differential amplifier that includes the plurality of amplification units 218A-218N depicted in FIG. 2 may be further resilient to SETR in comparison to other differential amplifiers that do not include such a plurality of driver units 224A-224N. For example it may be even less likely that one or more of driver units 224A-224N, as well as one or first and second circuits 262A-262N and 264A-264N, experience an SEU at substantially a same time such that an common output of the differential amplifier may be substantially perturbed due to SETR.

Figure 3:
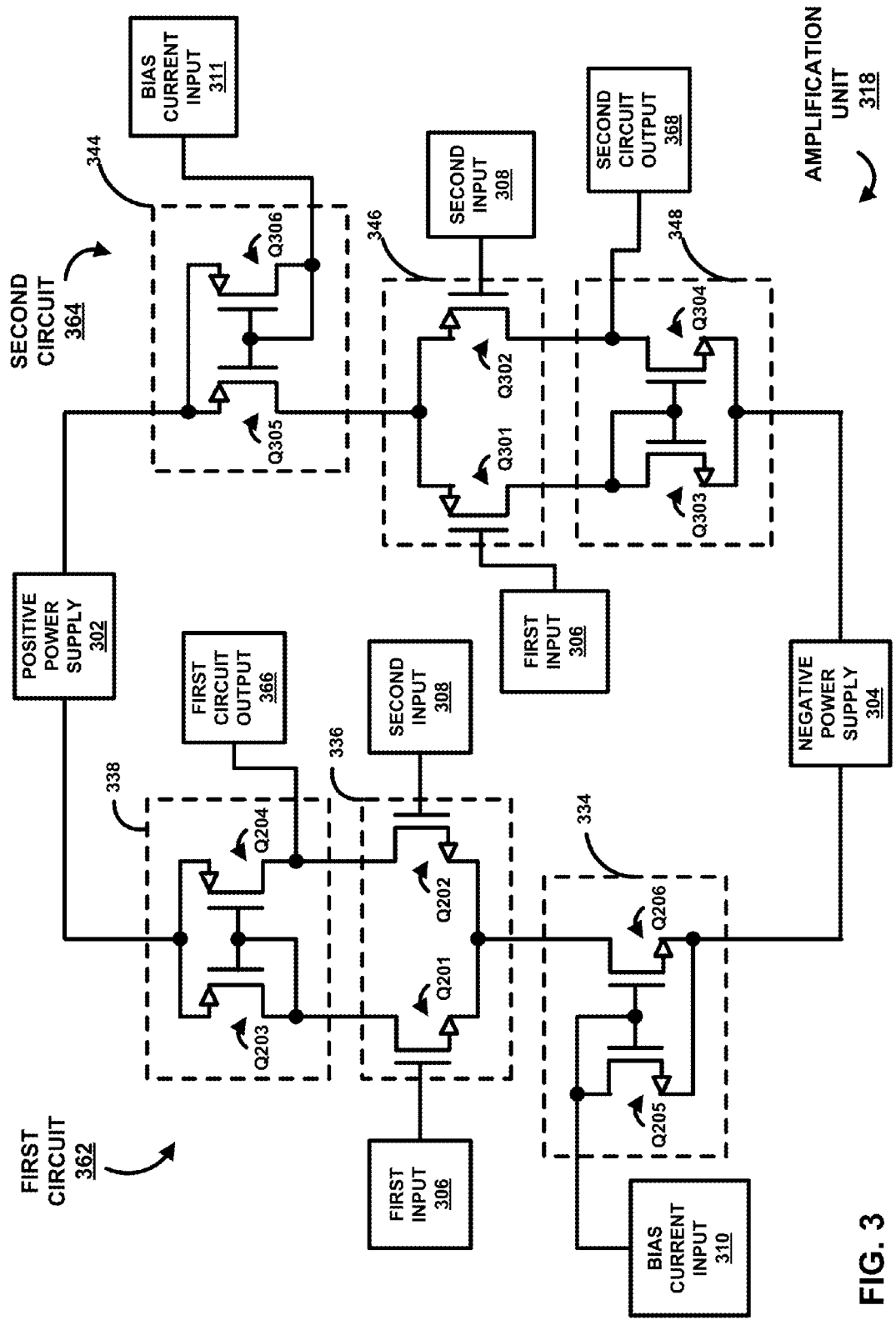
FIG. 3 is a circuit diagram that illustrates one example of a first circuit and a second circuit of an amplification module that may be used according to the techniques of this disclosure.

FIG. 3 is a circuit diagram that illustrates one example of a first circuit 362 and a second circuit 364 of an amplification unit 318. According to the techniques of this disclosure, the plurality of amplification units 118A-118N depicted in FIG. 1 a first circuit 362 and a second circuit 364, as shown according to amplification units 218A-218N depicted in FIG. 2. In other examples, the plurality of amplification units 118A-118N depicted in FIG. 1 may each comprise one of first circuit 362 or second circuit 364 depicted in FIG. 3. For example, the plurality of amplification units 118A-118N depicted in FIG. 1 may each comprise one of first circuit 362 or one of second circuit 364 depicted in FIG. 3.

According to the example of FIG. 3, each of first circuit and second circuit 362, 364 may be configured to receive a first component of a differential input signal at first input 306, and a second component of the differential signal at second input 308. Each of the respective first and second circuit 362, 364 may be configured to determine a difference between the received first and second components of the differential input signal, and amplify the determined difference to generate a first circuit output 366 and a second circuit output 364 that correspond to the determined difference. In some examples, first and second circuits 362, 364 may send the respective first circuit output 366 and second circuit output 364 to a driver unit (e.g., driver unit 424 depicted in FIG. 4) of an amplification module 318 that includes the respective first and second circuits 362.

According to the example of FIG. 3, first circuit 362 comprises an active load transistor pair 338, a differential amplifier transistor pair 336, and a bias current transistor pair 334. According to the example of FIG. 3, differential amplifier transistor pair 336 may operate to determine a difference between respective first and second components of a received differential input signal and amplify the determined difference to generate an output signal 366 of first circuit 362. In some examples, active load transistor pair 338 may operate to provide a load at an output of first circuit 362. In some examples, bias current transistor pair 334 may operate to provide differential amplifier transistor pair 336 with a DC bias for operation. In some examples, differential amplifier transistor pair 336 may amplify a determined difference by an amount based on a DC bias provided by bias current transistor pair 334.

According to the example of FIG. 3, the differential transistor pair 336 comprises transistors Q201 and Q202, active load transistor pair 338 comprises transistors Q203 and Q204, and bias current transistor pair 334 comprises transistors Q205 and Q206.

In general, differential amplifier transistor pair 336 and bias current transistor pair 334 comprise n-channel transistors. That is, differential amplifier transistor pair 336 and bias current transistor pair 334 are operable by applying gate voltages between gate terminals and source terminals of the transistors of the pairs. Furthermore, active load transistor pair 338 comprises p-channel transistors. That is, active load transistor pair 338 is operable by applying gate voltages between source terminals and gate terminals of the transistors of the pair.

Differential amplifier transistor pair 336 determines a difference between a first component and a second component of a differential signal received via first input 306 and second input 308 for first circuit 362, and amplifies the determined difference signal. In this example, differential amplifier transistor pair 336 comprises a first transistor Q201 and a second transistor Q202, coupled between active load transistor pair 338 and bias current transistor pair 334. For example, as shown in FIG. 3, the respective source terminals Q201 and Q202 are coupled to one another and to bias current transistor pair 334, the respective drain terminals of transistors Q201 and Q202 are each coupled to a drain terminal of a corresponding transistor of active load transistor pair 338, and the respective gate terminals of transistors Q201 and Q202 are coupled to second input 308 and first input 306, respectively.

In this example, second input 308 provides a gate voltage between the gate terminal and the source terminal of Q201. Similarly, first input 306 provides a gate voltage between the gate terminal and the source terminal of Q202. The gate voltage provided by each of first input 306 and second input 308 causes Q201 and Q202, respectively, to conduct a current that is proportional to the gate voltage. Each of Q201 and Q202 conducts the current between their respective drain terminal and their respective source terminal. The current passes from positive power supply 302 through a corresponding transistor of active load transistor pair 338 to enter the respective drain terminal, and from the respective source terminal through a transistor of bias current transistor pair 334, to negative power supply 204.

In this example, when first input 306 and second input 308 are different in value, causing Q201 and Q202 to conduct currents that are also different in value, active load transistor pair 338 may generate a current at the drain terminal of Q202 that is greater or lower than the current passing through Q202, as described in greater detail below. This difference between the currents, i.e., "difference" current, may generate a voltage at the drain terminal of Q202 that may be used as an output signal 366 of first circuit 362.

In other examples not shown in FIG. 3, first circuit 362 may include one or more, resistors, i.e., passive loads, in place of active load transistor pair 338. According to these examples, such a resistor may be coupled between positive power supply 302 and the drain terminal of each of Q201 and Q202. In these examples, voltages generated at the drain terminals of each of Q201 and Q202 as a result of the respective currents passing through Q201 and Q202 may be used collectively as an output 366 of first circuit 362. In any case, the resulting current or voltage(s) represent(s) an amplified difference between the first and the second components of the differential voltage signal received via first input 306 and second input 308.

Active load transistor pair 338 provides a load for differential amplifier transistor pair 336 used to amplify the differential voltage signal, as described above. According to the example of FIG. 3, active load transistor pair 338 comprises a third transistor Q203 and a fourth transistor Q204, coupled between positive power supply 302 and differential amplifier transistor pair 336. For example, source terminals of transistors Q203 and Q204 are coupled to positive power supply 302, drain terminals of transistors Q203 and Q204 are coupled to the drain terminals of transistors Q201 and Q202, respectively, and gate terminals of transistors Q203 and Q204 are coupled to one another and to the drain terminal of transistor Q203. In this manner, active load transistor pair 338 is configured as a current mirror such that a current passing through Q203 is substantially equal to a current passing through Q204.

In particular, active load transistor pair 338 causes, or "mirrors," the current passing through transistor Q201 of differential amplifier transistor pair 336 and transistor Q203 of active load transistor pair 338 to pass through transistor Q204 of active load transistor pair 338. As a result, the "mirrored" current passing through transistor Q204 and the current passing through transistor Q202, caused by the gate voltage provided by second input 308, may be different in value. This difference between the respective currents, referred to above as the "difference" current, represents a difference between the current passing through transistor Q201 and the current passing through transistor Q202, which corresponds to an amplified difference between the first component and the second component of the differential voltage signal. As described above, the difference current, and the resulting voltage, may be used as an output signal 366 of first circuit 362. As such, active load transistor pair 338 enables amplifying the difference between the first component and the second component of the differential voltage signal to generate a first circuit output 366 that corresponds to the amplified difference.

Bias current transistor pair 334 provides DC biasing of differential amplifier transistor pair 336. In this example, bias current transistor pair 334 comprises a sixth transistor Q206 coupled between differential amplifier transistor pair 336 and negative power supply 204. Bias current transistor pair 334 further comprises a fifth transistor Q205 coupled between bias current input 210 and negative power supply 204. For example, source terminals of transistors Q205 and Q206 are coupled to one another and to negative power supply 204, a drain terminal of transistor Q206 is coupled to the source terminals of transistors Q201 and Q202, a drain terminal of transistor Q205 is coupled to bias current input 210, and gate terminals of transistors Q205 and Q206 are coupled to one another and to bias current input 210. In this manner, bias current transistor pair 334 is configured as a current mirror such that a current passing through transistor Q205 is substantially equal to a current passing through transistor Q206.

In particular, transistor Q206 conducts a DC bias, or quiescent current for first circuit 362 from differential amplifier transistor pair 336 to negative power supply 204, biasing transistors Q201 and Q202 for performing the amplification of the differential voltage signal. Specifically, the DC bias current defines the total current passing through transistor Q201 and Q202, and biases transistor Q201 and Q202 to amplifying the difference between the first and the second components of the differential voltage signal. The DC bias current, passing from the drain terminal to the source terminal of transistor Q206, is controlled by a gate voltage between the gate terminal and the source terminal of transistor Q206, which, in turn, is controlled by transistor Q205 arranged in the current mirror configuration with transistor Q206. That is, the current passing from the drain terminal to the source terminal of transistor Q205, which is defined by bias current input 210, is "mirrored" to pass through transistor Q206, using the current mirror configuration. As such, bias current input 210 is used to control the DC bias current of first circuit 362.

In other examples, bias current transistor pair 334 may be replaced by a different implementation of a current source, or by a resistance. For example, rather than using Q205 and Q206 to provide the DC bias current for differential amplifier pair 336 as described above, another implementation of a current source, or a resistor coupled between the source terminals of transistors Q201 and Q202 and negative power supply 204, may be used to provide such a bias current.

As also depicted in the example of FIG. 3, second circuit 364 comprises an active load transistor pair 348, a differential amplifier transistor pair 346, and a bias current transistor pair 344. According to the example of FIG. 3, differential amplifier transistor pair 346 may operate to determine a difference between respective first and second components of a received differential input signal and amplify the determined difference to generate an output signal 368 of second circuit 364. In some examples, active load transistor pair 348 may operate to provide a load at an output of second circuit 364. In some examples, bias current transistor pair 344 may operate to provide differential amplifier transistor pair 346 with a DC bias for operation. In some examples, differential amplifier transistor pair 346 may amplify a determined difference by an amount based on a DC bias provided by bias current transistor pair 344.

According to this example, differential transistor pair 346 comprises transistors Q301 and Q302, active load transistor pair 348 comprises transistors Q303 and Q304, and bias current transistor pair 344 comprises transistors Q305 and Q306.

According to the example of FIG. 3, differential amplifier transistor pair 346 and bias current transistor pair 344 comprise p-channel transistors. That is, differential amplifier transistor pair 346 and bias current transistor pair 344 are operable by applying gate voltages between source terminals and gate terminals of the transistors of the pairs. Furthermore, active load transistor pair 348 comprises n-channel transistors. That is, active load transistor pair 348 is operable by applying gate voltages between gate terminals and source terminals of the transistors of the pair.

According to the example of FIG. 3, differential amplifier transistor pair 346 performs the amplification of the differential voltage signal received via first input 306 and second input 308 for amplification unit 318. According to the example of FIG. 3, differential amplifier transistor pair 346 comprises a first transistor Q301 and a second transistor Q302, coupled between bias current transistor pair 344 and active load transistor pair 348, both of which are described in greater detail below. Also according to this example, source terminals of transistors Q301 and Q302 are coupled to one another and to bias current transistor pair 344, drain terminals of transistors Q301 and Q302 are each coupled to a drain terminal of a corresponding transistor of active load transistor pair 348, and gate terminals of transistors Q301 and Q302 are coupled to second input 308 and first input 306, respectively.

According to the example of FIG. 3, second input 308 provides a gate voltage between the source terminal and the gate terminal of transistor Q301. Similarly, first input 306 provides a gate voltage between the source terminal and the gate terminal of transistor Q302. The gate voltage provided by each of first input 306 and second input 308 causes transistors Q301 and Q302, respectively, to conduct a current that is proportional to the gate voltage. Each of transistors Q301 and Q302 conducts the respective current between the respective source terminal and the respective drain terminal. The current passes from positive power supply 302 through a transistor of bias current transistor pair 344 to enter the respective source terminal of transistors Q301 and Q302, and from the respective drain terminal through a corresponding transistor of active load transistor pair 348, to negative power supply 304.

In this example, when first input 306 and second input 308 are different in value, causing transistors Q301 and Q302 to conduct currents that are also different in value, active load transistor pair 348 may generate a current at the drain terminal of transistor Q302 that is greater or lower than the current passing through transistor Q302, as described in greater detail below. This difference between the currents, i.e., the difference current as previously described, may generate a voltage at the drain terminal of transistor Q302 that may be used as an amplified difference signal 330 of amplification unit 318.

In some examples not depicted in FIG. 3, active load transistor pair 348 may be replaced by one or more resistors. According to such examples, the one or more resistors may be coupled between the drain terminal of each of transistors Q301 and Q302 and negative power supply 304. In these examples, voltages generated at the drain terminals of each of Q301 and Q302 as a result of the respective currents passing through Q301 and Q302 may once again be used collectively as amplified difference signal 330. As previously described, the resulting current or voltage(s) represent(s) an amplified difference between the first and the second components of the differential voltage signal received via first input 306 and second input 308.

As also previously described, active load transistor pair 348 provides a load for differential amplifier transistor pair 346 used to amplify the differential voltage signal. In this example, active load transistor pair 348 comprises a third transistor Q303 and a fourth transistor Q304, coupled between differential amplifier transistor pair 346 and negative power supply 304. For example, source terminals of transistors Q303 and Q304 are coupled to negative power supply 304, drain terminals of transistors Q303 and Q304 are coupled to the drain terminals of transistors Q301 and Q302, respectively, and gate terminals of transistors Q303 and Q304 are coupled to one another and to the drain terminal of transistor Q303. In this manner, active load transistor pair 348 is configured as a current mirror such that a current passing through transistor Q303 is substantially equal to a current passing through transistor Q304.

In this example, active load transistor pair 348 mirrors the current passing through transistor Q301 of differential amplifier transistor pair 346 and transistor Q303 of active load transistor pair 348 to pass through transistor Q304 of active load transistor pair 348. As a result, the mirrored current passing through transistor Q304 and the current passing through transistor Q302, caused by the gate voltage provided by second input 308, may be different in value. This difference between the currents, referred to above as the difference current, represents a difference between the current passing through transistor Q301 and the current passing through transistor Q302, which once again corresponds to the amplified difference between the first component and the second component of the differential voltage signal.

Also according to the example of FIG. 3 bias current transistor pair 344 provides DC biasing of differential amplifier transistor pair 346. In this example, bias current transistor pair 344 comprises a fifth transistor Q305, coupled between positive power supply 302 and differential amplifier transistor pair 346. Bias current transistor pair 344 further comprises a sixth transistor Q306, coupled between positive power supply 302 and bias current input 311. For example, source terminals of transistors Q305 and Q306 are coupled to one another and to positive power supply 302, a drain terminal of transistor Q305 is coupled to the source terminals of transistors Q301 and Q302, a drain terminal of transistor Q306 is coupled to bias current input 311, and gate terminals of transistors Q305 and Q306 are coupled to one another and to bias current input 311. In this manner, bias current transistor pair 344 is configured as a current mirror such that a current passing through transistor Q306 is substantially equal to a current passing through transistor Q305.

In this example, transistor Q305 conducts a DC bias, or quiescent current for amplification unit 318 from positive power supply 302 to differential amplifier transistor pair 344, biasing transistors Q301 and Q302 for performing the amplification of the differential voltage signal. The DC bias current defines the total current passing through transistors Q301 and Q302, and biases transistors Q301 and Q302 for amplifying the difference between the first and the second components of the differential voltage signal. The DC bias current, passing from the source terminal to the drain terminal of transistor Q305, is controlled by a gate voltage between the gate terminal and the source terminal of transistor Q305, which is controlled by transistor Q306 arranged in the current mirror configuration with transistor Q305. That is, the current passing from the source terminal to the drain terminal of transistor Q306, which is defined by bias current input 311, is mirrored to pass through transistor Q305, using the current mirror configuration. As such, bias current input 311 is used to control the DC bias current of second circuit 364.

As previously described, in other examples, bias current transistor pair 344 may be replaced by a different implementation of a current source, or by a resistance. For example, rather than using transistors Q305 and Q306 to provide the DC bias current for differential amplifier pair 346 as described above, another implementation of a current source, or a resistor coupled between positive power supply 302 and the source terminals of transistors Q301 and Q302, may be used to provide the current.

It should be noted that second circuit 364 of FIG. 3 provides amplification of the differential voltage signal for first and second component voltage values, referenced to negative power supply 304, ranging from a voltage of negative power supply 304 to a voltage of positive power supply 302 less a minimum gate voltage of transistors Q301 and Q302 of differential amplification transistor pair 346, plus a minimum voltage required for operability of bias current transistor pair 344, subject to a maximum gate voltage of transistors Q301 and Q302.

According to some examples, a differential amplifier 100 configured to operate consistent with the techniques of this disclosure may comprise a plurality of amplification units 118A-118N that each include both of a first circuit 362 and a second circuit 364 depicted in FIG. 3. According to such examples, the first circuit 362 and the second circuit 364 may supply respective first and second output signals 366, 368 to a driver unit (e.g., driver unit 224 depicted in FIG. 2) which may operate to combine the first and second output signals 366, 368 to generate an amplified difference signal 230A-230N as an output of the respective amplification unit 118A-118N. As described above, in other examples, one or more of amplification units 118A-118N may comprise only one of first circuit 362 and second circuit 364 depicted in FIG. 3. According to these examples, the one of first circuit 362 or second circuit 364 used as the respective amplification units 118A-118N may not provide the respective first or second output signal 366, 368 to a driver circuit. Instead, the first circuit 362 or second circuit 364 used independently may provide the respective first or second output signals 366, 368 as an amplified difference signal 130A-130N generated by of the respective amplification unit 118A-118N.

In some examples, whether or not a plurality of amplification units 118A-118N includes first circuit 362 and second circuit 364, or one of first circuit 362 and second circuit 364, the respective amplification units 118A-118N may output a plurality of amplified difference signals 130A-130 to a combination module 116 as depicted in FIG. 1. Such a combination module 116 may comprise a circuit node or other component configured to combine the plurality of received amplified difference signals to generate a common output signal 112.

As described above, according to examples where the plurality of amplification units 118A-118N depicted in FIG. 1 include a first circuit 262A-264N and a second circuit 264A-264N such as amplification units 218A-218N as depicted in the example of FIG. 2, the plurality of amplification units 118A-118N also include a driver unit 224A-224N. Each driver unit 224A-224N may be configured to receive an output 266A-266N of the first circuit 262A-264N and an output 268A-268N of the second circuit 264A-264N, and combine the first output 266A-266N and the second output 268A-268N to generate an amplified difference signal 230A-230N that comprises an output of the amplification units 118A-118N.

Figure 4:
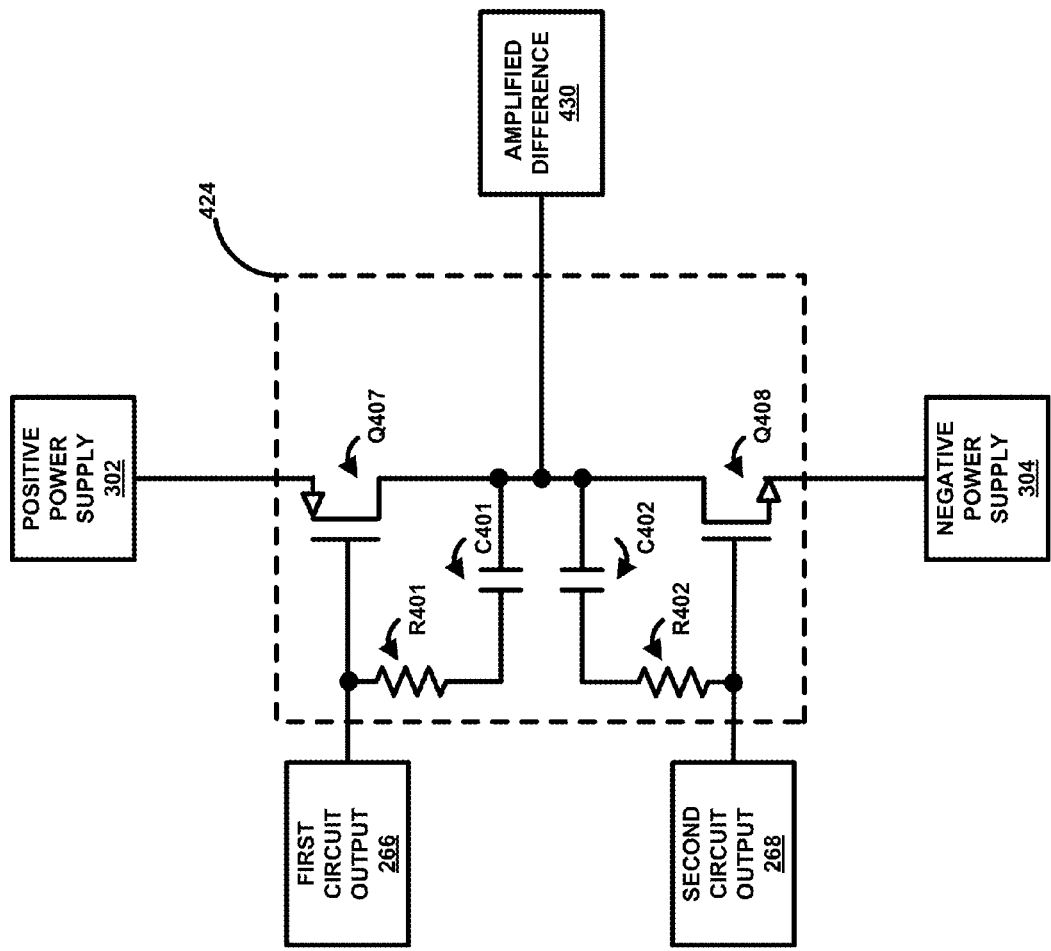
FIG. 4 is a circuit diagram that illustrates one example of a driver unit that may be used according to the techniques of this disclosure.

FIG. 4 is a circuit diagram that illustrates one example of a driver circuit 424 that may be used according to the techniques of this disclosure. The driver unit 424 of FIG. 4D may correspond to one or more of driver units 224A-224N of FIG. 2. That is, one or more of driver units 224A-224N may comprise driver unit 424. Generally speaking, driver unit 424 depicted in FIG. 4 may be configured to receive a first output 266 (e.g., first output 366 depicted in FIG. 3) from a first circuit 262 of an amplification unit (e.g., an amplification unit 218A-218N of FIG. 2), and a second output 268 (e.g., second output 368 depicted in FIG. 3) from a second circuit 264 of the amplification unit, and combine the first and second output signals to generate an amplified difference signal 430 that comprises an output of the amplification unit 218A-218N.

According to the example of FIG. 4, driver unit 424 comprises two complementary transistors Q407 and Q408 configured as a push-pull inverter. In some examples, driver unit 424 is configured to receive first and second output signals 266, 268 and reduce voltage drops of the first and second output signals, allowing the signals to substantially reach the "rails," i.e., voltage levels of positive power supply 302 and negative power supply 304 to generate the amplified difference signal 430. In other words, driver unit 424 provides necessary conditioning of first and second output signals 366, 368, such that the signals have a dynamic range that is substantially equal to a difference between the voltage values of positive power supply 302 and negative power supply 304. For example, if positive power supply 302 provides a voltage of 1.3 VDC, and negative power supply 304 provides a voltage of 0 VDC (i.e., ground), the output signal of amplified difference signal 430 may have a value ranging substantially between 0 VDC and 1.3 VDC. As described above, in this example, amplified difference signal 430 may correspond to an output of one of amplification units 218A-218N of FIG. 2.

According to the example of FIG. 4, driver unit 424 may also act to combine first and second output signals 266, 268, e.g., which may be generated by a first circuit 262 and second circuit 264 of an amplification unit 218A-218N, as depicted according to the example of FIG. 2.

As also previously described, first circuit 262 and second circuit 264 may be operable over different input voltage ranges corresponding to first input 206 and second input 208. As such, when amplification unit 218A-218N comprises both amplification unit first circuit 262 and second circuit 264, driver unit 424 may act to combine the received first and second output signals 262, 264 to generate the common output signal of output 412 over the entire voltage range of both first circuit 262 and second circuit 264.

According to the example of FIG. 4, driver unit 424 comprises a first transistor Q507 and a second transistor Q508, coupled between positive power supply 302 and negative powers supply 304, and arranged as a complementary push-pull inverter. For example, a source terminal of transistor Q507 is coupled to positive power supply 302, a drain terminal of transistor Q507 is coupled to the output 412 of driver unit 424, and a gate terminal of transistor Q507 is coupled to a first output signal 266. Furthermore, a drain terminal of transistor Q508 is coupled to the output 412, a source terminal of transistor Q508 is coupled to negative power supply 304, and a gate terminal of transistor Q508 is coupled to second output signal 268.

Additionally, driver unit 424 further comprises, for each of transistors Q507 and Q508, a compensation circuit including a resistor R501, R502, respectively, and a capacitor C501, C502, respectively, coupled in series between the respective amplified difference signal and output 412. The compensation circuit acts to provide stability to operation of driver unit 424 over a frequency range. In other examples consistent with the techniques of this disclosure, driver unit 424 may not include the compensation circuit depicted in the example of FIG. 4.

As described above, the techniques of this disclosure are directed to a radiation hardened differential amplified 100 that includes an amplification module 100 that includes a plurality of amplification units 118A-118N. As also described above, the plurality of amplification units 118A-118N may each include a first circuit 262A-262N, a second circuit 264A-264N, and a driver unit 224A-224N. FIG. 3 depicts one example of such a first circuit 362 and a second circuit 364, and FIG. 4 depicts one example of such a driver unit 424. According to examples where the plurality of amplification units 118A-118N each include first circuit 262A-262N, a second circuit 264A-264N, driver unit 224A-224N may receive first 266 and second 268 outputs from the respective first and second circuits, to generate a plurality of amplified difference signals 130A-130N (230A-230N in the example of FIG. 2) as an output of the plurality of amplification units 118A-118N (218A-218N).

In other examples, the plurality of amplification units 118A-118N may each comprise only one of first circuit 262A-262N or second circuit 264A-264N. According to these examples, the respective first output 266A-266N or second output 268A-268N may be used as an output of the plurality of amplification units 118A-118N.

Figure 5A:
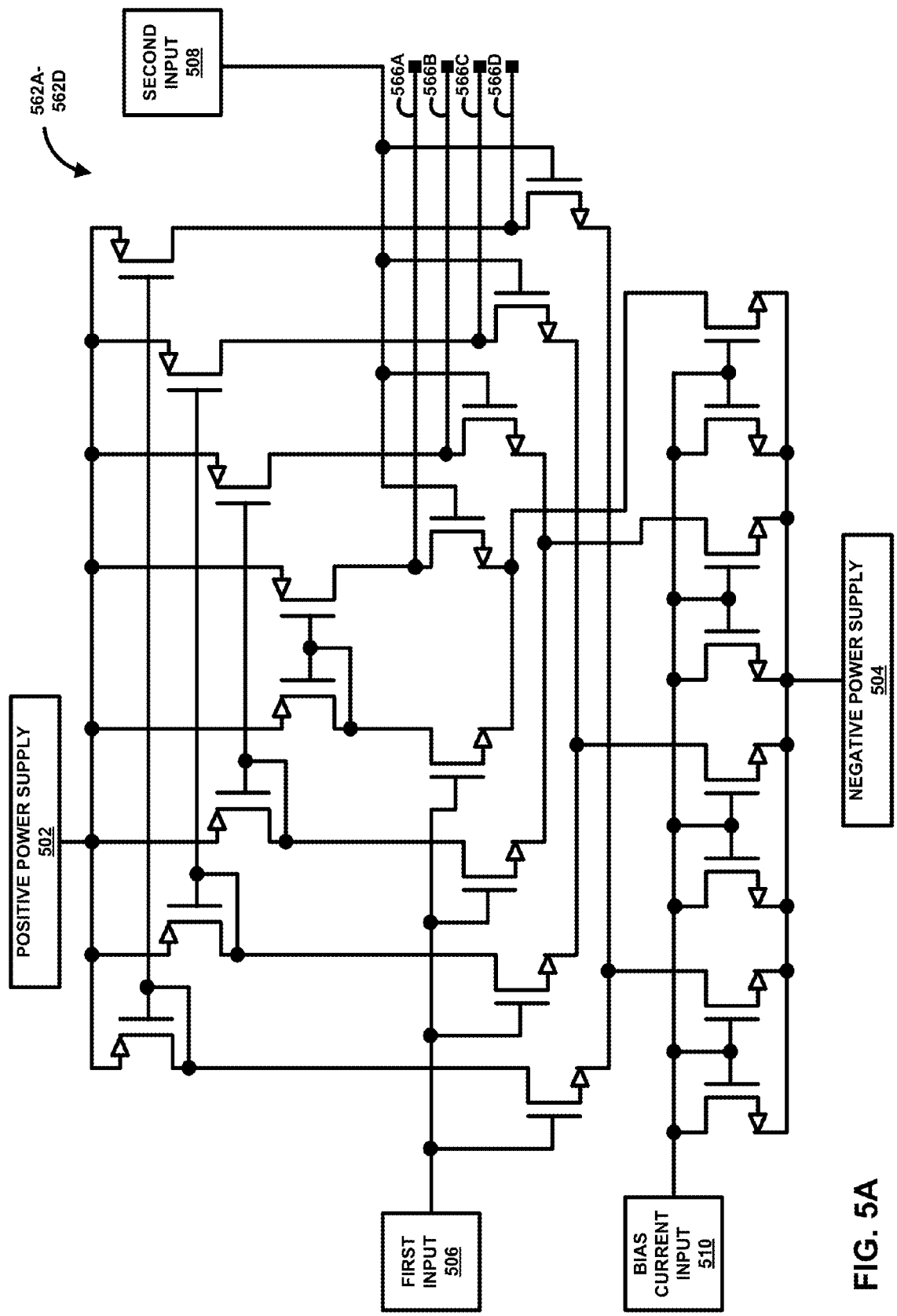
FIG. 5A is a circuit diagram that illustrates one example of a plurality of first circuits consistent with the techniques of this disclosure.

Whether or not the plurality of amplification units 118A-118N each include a first circuit 262 and a second circuit 264 as depicted in FIG. 2, the plurality of amplification units 118A-118N may each output an amplified difference signal 230A-230N to a combining module 116. The plurality of amplified difference signals 230A-230N may, FIG. 5A is a circuit diagram that illustrates one example of a plurality of first circuits 562A-562D configured to generate a plurality of first circuit output signals 566A-566D. In some examples, the plurality of first circuits 562A-562D depicted in the example of FIG. 5A may be used alone as a plurality of amplification unit 118A-118N to generate the plurality of amplified difference signals 130A-130N. In other examples, the plurality of first circuits 562A-562D depicted in the example of FIG. 5A may be used in combination with a plurality of second circuits 564A-564D, such as depicted in FIG. 5B, as well as a plurality of driver units 224A-224D, as depicted in the example of FIG. 6.

Figure 5B:
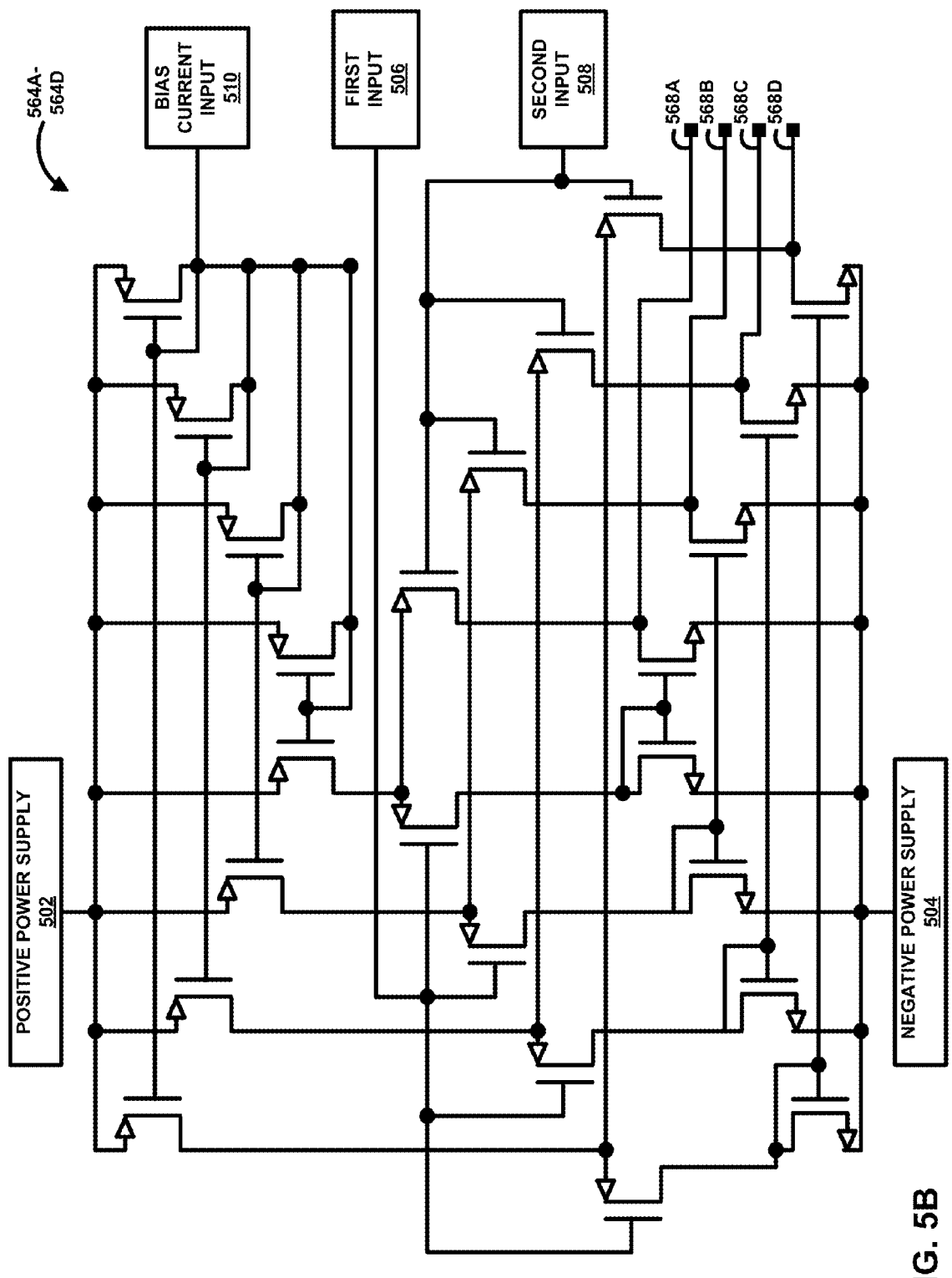
FIG. 5B is a circuit diagram that illustrates one example of a plurality of second circuits consistent with the techniques of this disclosure.
Figure 6:
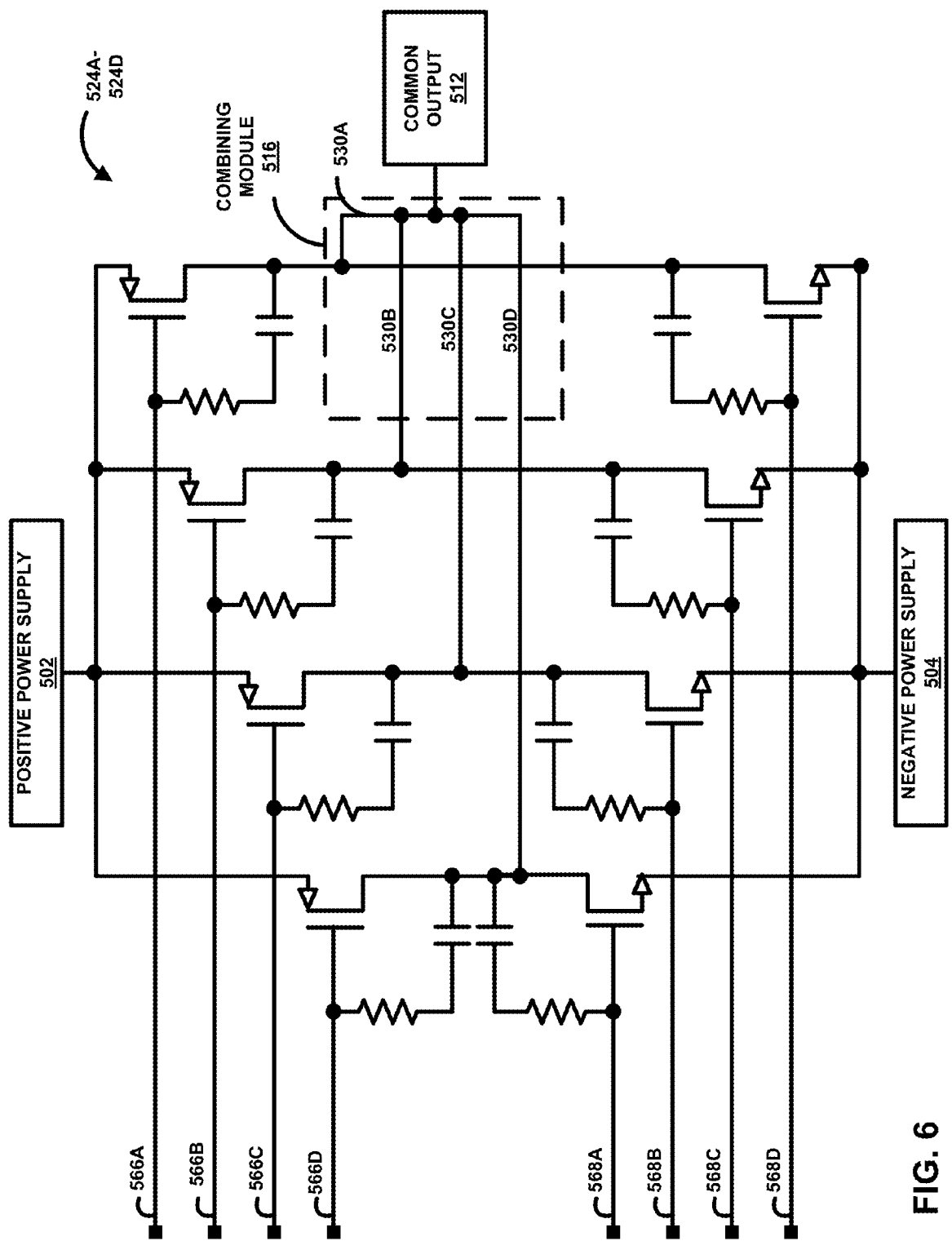
FIG. 6 is a circuit diagram that illustrates one example of a plurality of second circuits consistent with the techniques of this disclosure.

As shown in FIG. 5A, the plurality of first circuits 562A-562D depicted in FIG. 5 each comprise a first circuit 362 as depicted in FIG. 3. For example, each of the plurality of first circuits 562A-562D depicted in FIG. 5 includes an active load transistor pair 338, a differential amplifier transistor pair 336, and a bias current transistor pair 334, that operate as described above. In this manner, each of the plurality of first circuits depicted in FIG. may operate to generate a plurality of first output signals 566A-566D, that each comprise an first circuit output signal 366 as depicted in FIG. 3. Again, the plurality of first circuits 562A-562D depicted in FIG. 5A may be used alone, or in combination with the plurality of second circuits 564A-564D depicted in FIG. 5B, as a plurality of amplification units 118A-118N of an amplification module 114.

FIG. 5B is a circuit diagram that illustrates one example of a plurality of second circuits 564A-564D configured to generate a plurality of first circuit output signals 568A-568D. In some examples, the plurality of second circuits 564A-564D depicted in the example of FIG. 5B may be used alone as a plurality of amplification units 118A-118N to generate the plurality of amplified difference signals 130A-130N. In other examples, the plurality of second circuits 564A-564D depicted in the example of FIG. 5B may be used in combination with a plurality of first circuits 562A-562D, such as depicted in FIG. 5A, as well as a plurality of driver units 524A-524D, as depicted in the example of FIG. 6.

As shown in FIG. 5B, the plurality of second circuits 564A-564D depicted in FIG. 5B each comprise a second circuit 364 as depicted in FIG. 3. For example, each of the plurality of second circuits 564A-564D depicted in FIG. 5 includes an active load transistor pair 348, a differential amplifier transistor pair 346, and a bias current transistor pair 344, that operate as described above. In this manner, each of the plurality of second circuits 564A-564D depicted in FIG. 5B may operate to generate a plurality of second output signals 568A-568D, that each comprise a second circuit output signal 368 as depicted in FIG. 3. Again, the plurality of second circuits 564A-564D depicted in FIG. 5B may be used alone, or in combination with the plurality of first circuits 562A-562D depicted in FIG. 5A, as a plurality of amplification units 118A-118N of an amplification module 114.

FIG. 6 is a circuit diagram that illustrates one example of a plurality of driver units 524A-524D, that may be used with a plurality of first circuits 562A-562D and plurality of second circuits 564A-564D as a plurality of amplification units 218A-218N of a radiation hardened differential amplifier, as described above with respect to FIG. 2. As shown in the example of FIG. 6, the plurality of driver units 524A-524D include a plurality of the driver unit 424 depicted in FIG. 4. According to the example of FIG. 6, the plurality of driver units 524A-524D each include a push pull inverter and a compensation circuit, configured to operate as described above with respect to FIG. 4. For example, the plurality of driver units 524A-524D depicted in FIG. 4 may each receive a respective first output 566A-566D from the plurality of first circuits depicted in FIG. 5A, and a second output 568A-568D from the plurality of second circuits. According to this example, the plurality of driver units 524A-524D depicted in FIG. 6 may operate to combine the received first and second outputs, in order to generate a plurality of amplified difference signals 530A-530D.

FIG. 6 also depicts one example of a combining module 516. Combining module 516 may correspond to combining module 116 depicted in FIG. 1. As shown in FIG. 6, combining module 516 comprises a signal node configured to receive each of the plurality of amplified difference signals 530A-530D. In this manner, combining module 516 may operate to combine the plurality of difference signals 530A-530D at a common output 512. In some examples, as described in further detail above, the common output 512 depicted in FIG. 6 may be more resilient to SETR in comparison with an output of other differential amplifiers.

Figure 7:
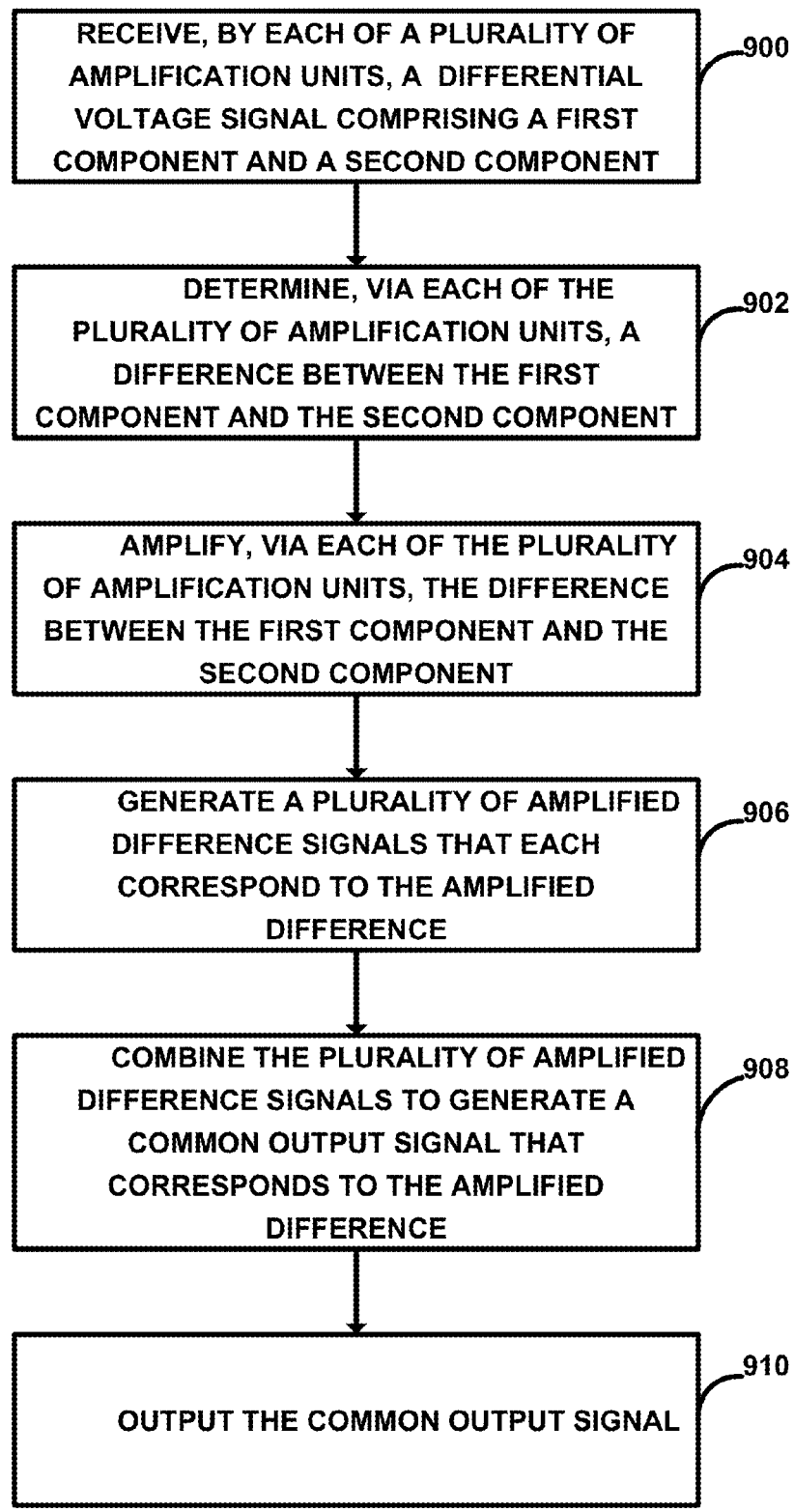
FIG. 7 is a flow diagram that illustrates one example of a method of amplifying a differential voltage signal consistent with the techniques of this disclosure.

FIG. 7 is a flow diagram that illustrates one example of a method of amplifying a differential voltage signal consistent with the techniques of this disclosure. As depicted in FIG. 7, amplifier 100 may receive, by each of a plurality of amplification units a differential voltage signal comprising a first component and a second component (900). As previously described with reference to FIG. 1, the plurality of amplification units may comprise amplification units 118A-118N. As also previously described, in some examples, the first and the second components of the differential voltage signal may comprise positive signals with reference to ground, negative signals with reference to ground, and any combination thereof.

As also depicted in FIG. 7, amplifier 100 may determine, via each of the plurality of amplification units, a difference between the first component and the second component (902). For example, amplification units 118A-118N may each determine the difference between the first component and the second component. Such a difference may comprise a positive difference, such as where the first component is greater than the second component, or a negative difference, such as where the second component is greater than the first component.

As also depicted in FIG. 7, amplifier 100 may amplify, via each of the plurality of amplification units, the difference between the first component and the second component (904). For example, amplification units 118A-118N may each amplify the difference using respective differential amplifier transistor pairs, active load transistor pairs, and bias current transistor pairs, as also previously described.

As also depicted in FIG. 7, amplifier 100 may generate a plurality of amplified difference signals that each correspond to the amplified difference (906). As also previously described, amplification units 118A-118N may each generate one of the plurality of amplified difference signals as a result of amplifying the difference between the first component and the second component. For example, amplification units 118A-118N may generate amplified difference signals 130A-130N, respectively.

As also depicted in FIG. 7, amplifier 100 may combine the plurality of amplified difference signals to generate a common output signal corresponding to the amplified difference (908). As also depicted in FIG. 6, amplifier 100 may output the common output signal (910).

Figure 8:
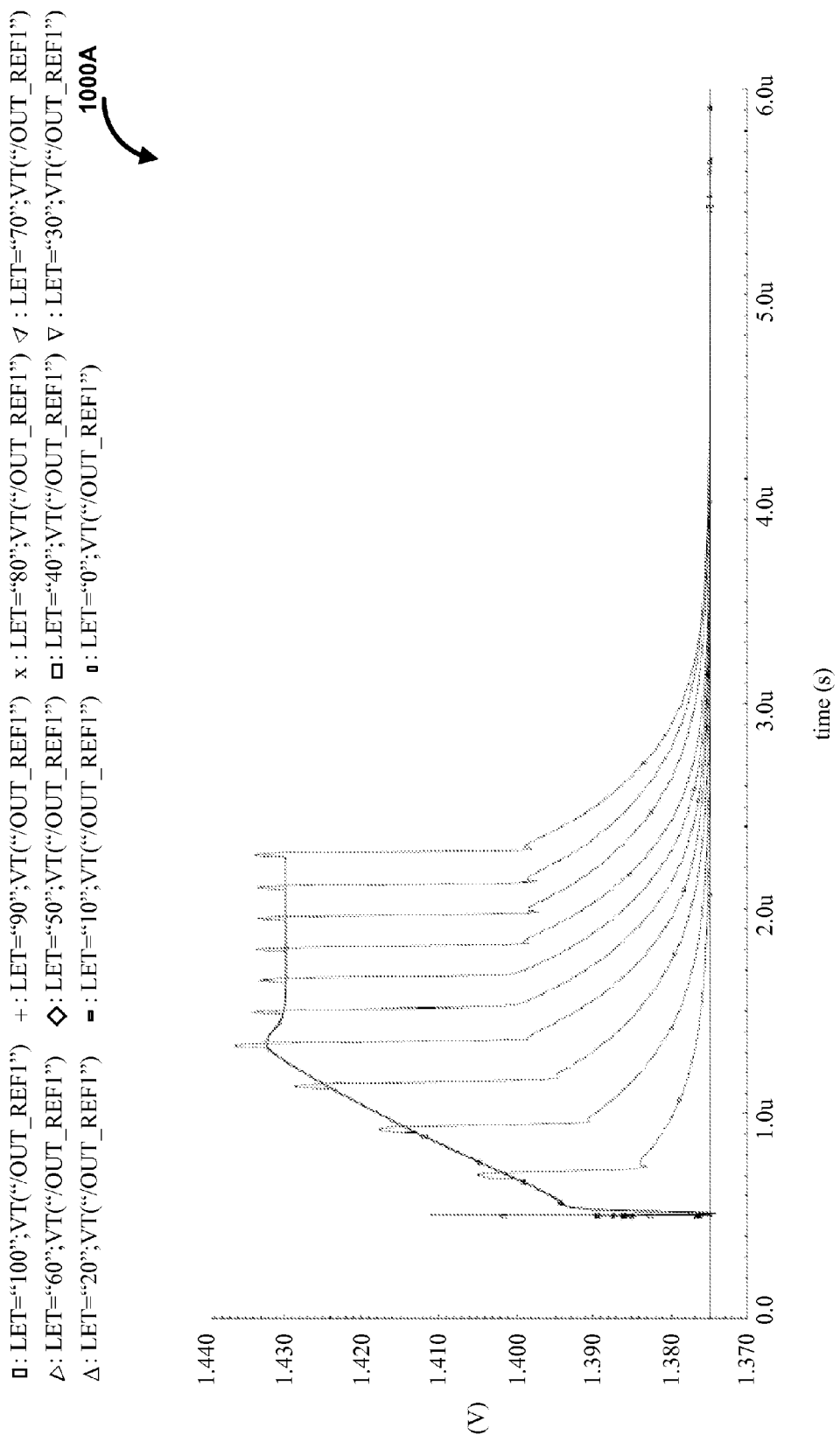
FIGS. 8-11 are graphs that illustrate experimental results corresponding to responses to single event transient radiation of a standard analog differential amplifier and a radiation hardened differential amplifier consistent with the techniques of this disclosure.
Figure 9:
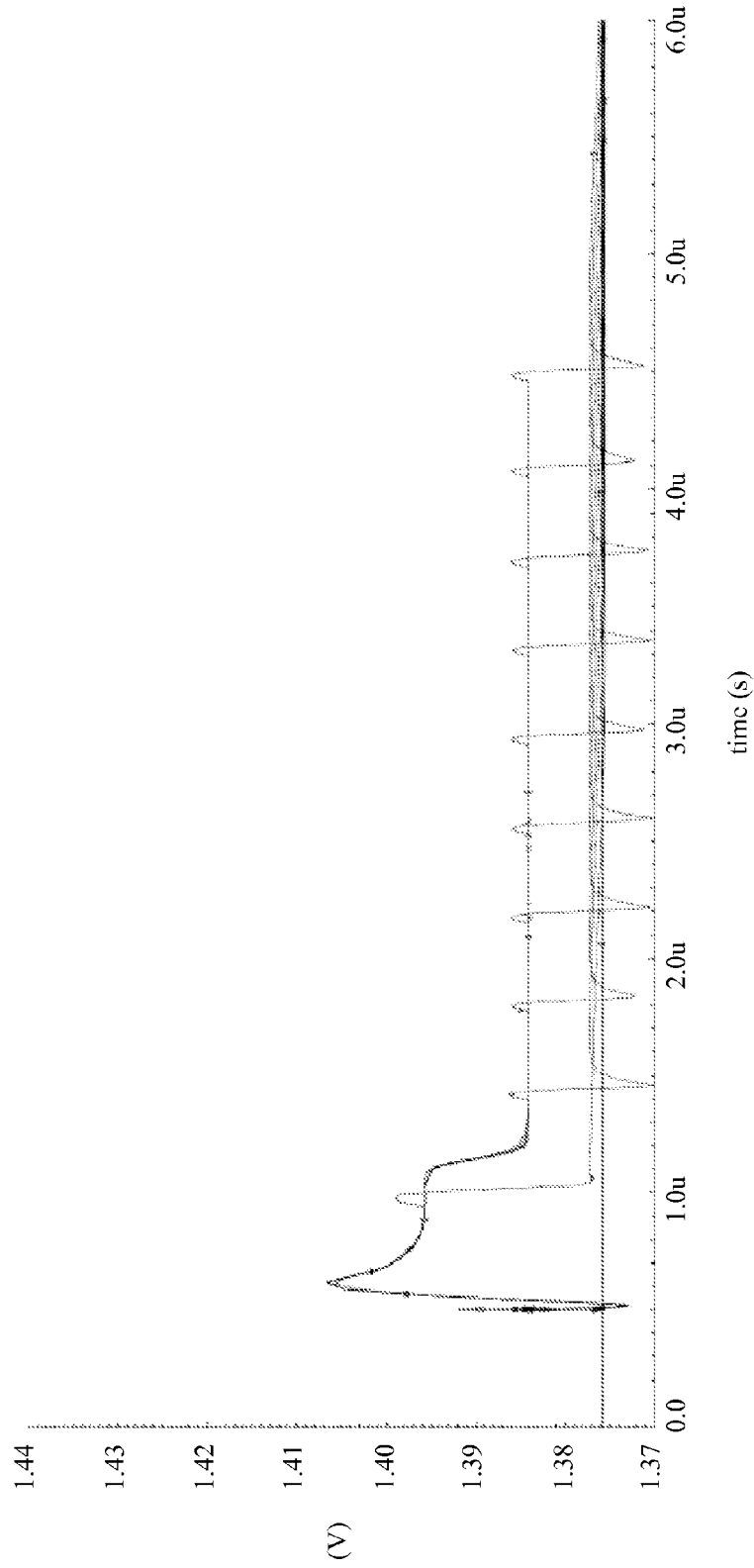

FIGS. 8-11 are graphs that illustrate experimental results corresponding to responses to SETR of a standard differential amplifier and a radiation-hardened differential amplifier consistent with the techniques of this disclosure. FIG. 8 illustrates the response of the standard amplifier to SETR, simulated using a plurality of linear energy transfer (LET) stimuli (i.e., LET 0-100). FIG. 9 illustrates the response of the radiation-hardened amplifier to SETR, simulated using the same LET stimuli. In this example, each LET stimulus, valued between 0 and 100 in increments of 10, corresponds to an amount of energy transferred to the respective amplifier by an ionizing radiation particle. In the example of FIG. 8, a steady-state (i.e., unaffected) output signal of the standard amplifier has a voltage value approximately equal to 1.375V, and a perturbed output signal, corresponding to LET 40, has a peak voltage value approximately equal to 1.43V. In the example of FIG. 9, a steady-state output signal of the radiation-hardened amplifier also has a voltage approximately equal to 1.375V, and a perturbed output signal, corresponding to a number of the LET stimuli, has a peak voltage approximately equal to 1.4065V.

As can be seen in FIGS. 8-9, the radiation-hardened amplifier may prevent or reduce the perturbations of the output signal of the amplifier caused by SETR relative to the perturbations of the output signal of the standard amplifier caused by SETR. Specifically, as depicted in FIGS. 8-9, perturbations of the output signal of the radiation-hardened amplifier are lower in amplitude relative to the perturbations of the output signal of the standard amplifier.

Figure 10:
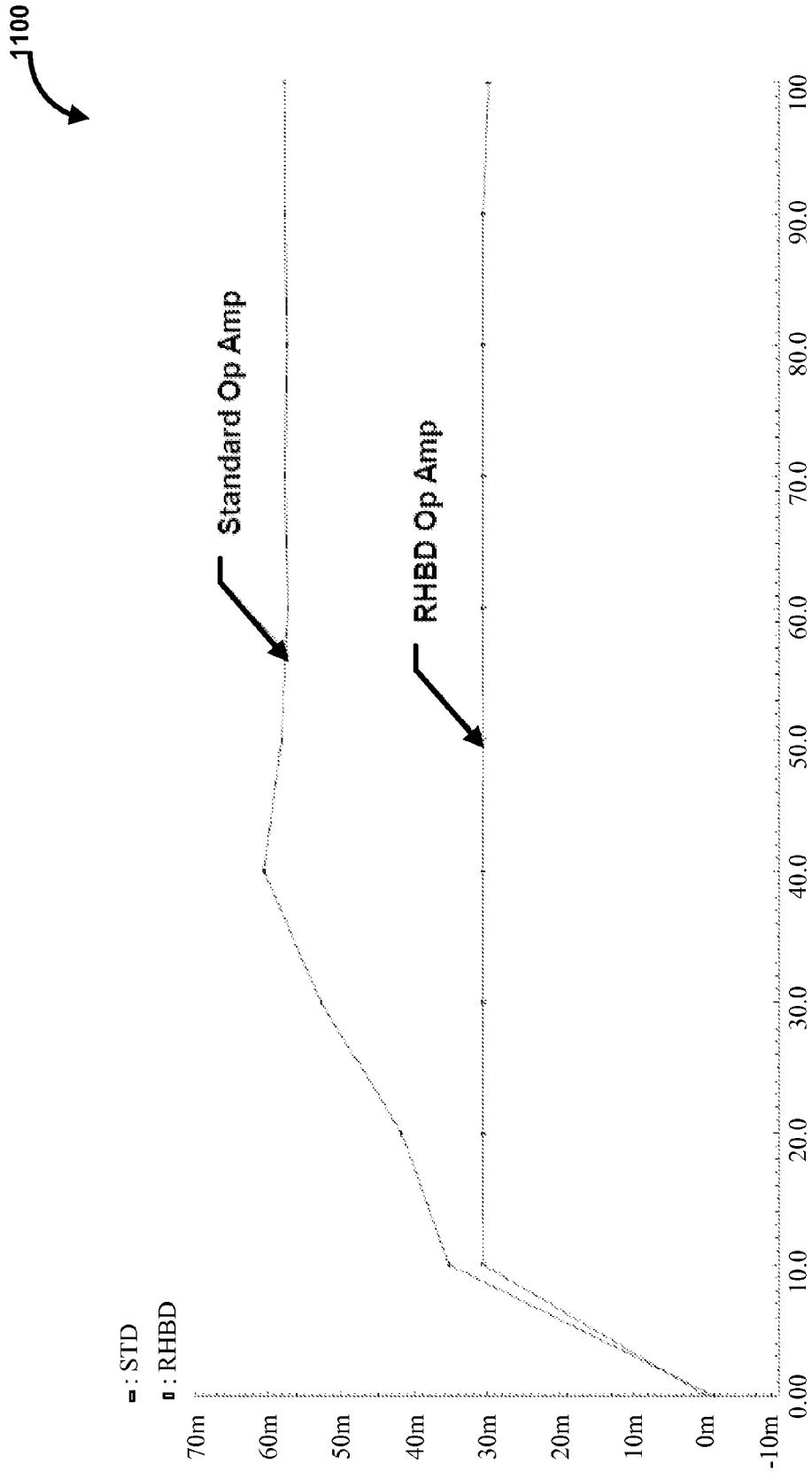

FIG. 10 depicts peak voltage deviations of the output signals of the standard amplifier and the radiation-hardened amplifier resulting from the LET stimuli of FIGS. 8-9. As depicted in FIG. 10, the peak voltage deviation of the output signal of the standard amplifier for all of the LET stimuli is approximately 60 mV, whereas the peak voltage deviation of the output signal of the radiation-hardened amplifier for all of the LET stimuli is approximately 30 mV, consistent with the examples of FIGS. 8-9. Once again, as can be seen in FIG. 10, the radiation-hardened amplifier may prevent or reduce the perturbations of the output signal of the amplifier caused by the SETR relative to the perturbations of the output signal of the standard amplifier caused by the SETR.

Figure 11:
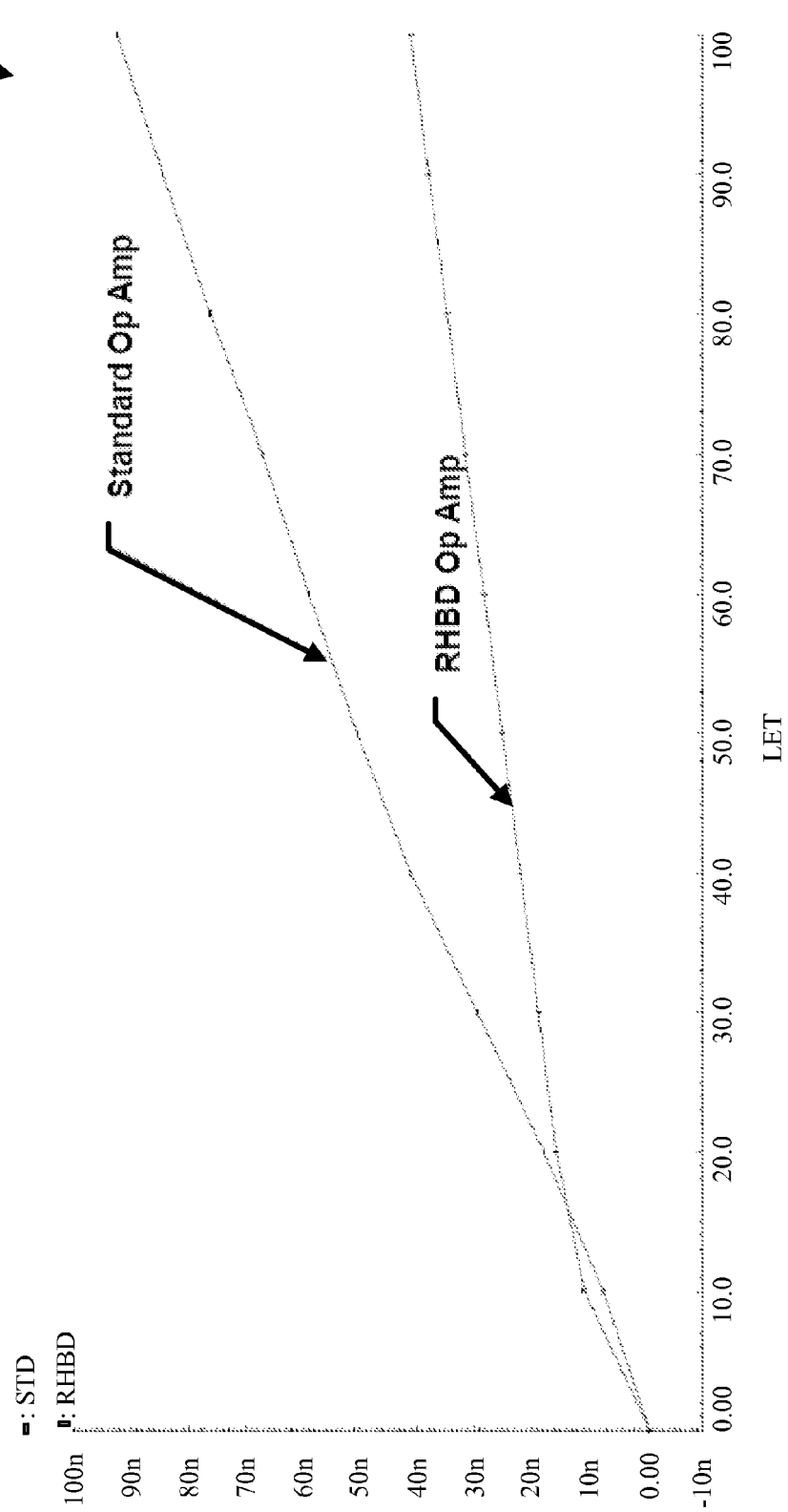

FIG. 11 illustrates time-integrated responses of the standard amplifier and the radiation-hardened amplifier depicted in FIGS. 8-9. Referring back to FIGS. 8-9, it can be seen that, although the perturbed output signals of the radiation-hardened amplifier have a peak voltage value that is lower than a peak voltage value of the perturbed output signals of the standard amplifier, the durations of the perturbations of the output signals of the radiation-hardened amplifier are generally longer than the durations of the perturbations of the output signals of the standard amplifier. For example, as depicted in FIG. 8, most of the perturbations of the output signals of the standard amplifier decay approximately 3 us after the corresponding stimulus. In contrast, as depicted in FIG. 9, most of the perturbations of the output signals of the radiation-hardened amplifier decay approximately 4.5 us after the corresponding stimulus.

Nevertheless, as depicted in FIG. 11, the time-integrated responses of the standard amplifier and the radiation-hardened amplifier of FIGS. 8-9 indicate that, advantageously, the perturbations of the output signals of the radiation-hardened amplifier may have less adverse impact on a load of the amplifier, despite their longer durations, than the perturbations of the output signals of the standard amplifier would have on the same load. For example, the time-integrated responses of FIG. 11 may correspond to different amounts of charge delivered by the perturbed output signals to a capacitive load for each LET stimulus, wherein the perturbations of the output signals of the radiation-hardened amplifier are shown to deliver less charge to the load than the perturbations of the output signals of the standard amplifier. Accordingly, the lower peak voltage value of the perturbations of the output signals of the radiation-hardened amplifier relative to the peak voltage value of the perturbations of the output signals of the standard amplifier is still advantageous despite the longer durations of the perturbations of the output signals of the radiation-hardened amplifier relative to the perturbations of the output signals of the standard amplifier.

Various examples have been described herein. These and other examples are within the scope of the following claims.

The invention claimed is:

1. A method of amplifying a differential voltage signal, the method comprising:
   receiving, by each of a plurality of amplification units, a differential voltage signal comprising a first component and a second component;
   determining, via each of the plurality of amplification units, a difference between the first component and the second component of the differential voltage signal;
   amplifying, via each of the plurality of amplification units, the difference between the first component and the second component of the differential voltage signal to generate a plurality of amplified difference signals that each correspond to the amplified difference, wherein at least two of the plurality of amplification units comprises a first amplification circuit, a second amplification circuit, and a driver unit, and wherein the driver unit is configured to receive a first output of the first amplification circuit and a second output of the second amplification circuit, and combine the first output and second output as an amplified difference signal;
   combining the plurality of amplified difference signals to generate a common output signal that corresponds to the amplified difference; and
   outputting the common output signal.

2. The method of claim 1, wherein combining the plurality of amplified difference signals to generate the common output signal comprises combining the plurality of amplified difference signals at a common output node.

3. The method of claim 1, wherein combining the plurality of amplified difference signals to generate the common output signal, prevents or reduces an effect caused by one or more single event transient (SET) particles incident upon one or more of the plurality of amplification units.

4. A differential amplifier comprising:
   a first voltage source;
   a second voltage source;
   an amplification module including a plurality of amplification units configured to amplify a difference between a first component and a second component of a differential voltage signal to generate a plurality of amplified difference signals that each correspond to the amplified difference, wherein at least two of the plurality of amplification units comprises:

an first output node;
a first circuit element coupled between the first voltage source and the first output node;
a common node;
a first transistor coupled between the first output node and the common node;
a second transistor coupled between the common node and a second circuit element, the second circuit element coupled between the first voltage source and the second transistor; and
a third circuit element coupled between the common node and the second voltage source; and
a combination module configured to combine the plurality of amplified difference signals to generate a common output signal that corresponds to the amplified difference.

5. The differential amplifier of claim 4, wherein the first circuit element and the second circuit element each comprises a resistor.

6. The differential amplifier of claim 4, wherein the first circuit element comprises a third transistor, and wherein the second circuit element comprises a fourth transistor, the fourth transistor having a gate terminal coupled to the second transistor and to a gate terminal of the third transistor.

7. The differential amplifier of claim 4, wherein the third circuit element comprises a resistor.

8. The differential amplifier of claim 4, wherein the third circuit element comprises a fifth transistor, the differential amplifier further comprising:
a third voltage source; and
a sixth transistor coupled between the third voltage source and the second voltage source, the sixth transistor having a gate terminal coupled to the third voltage source and to a gate terminal of the fifth transistor.

9. The differential amplifier of claim 4, wherein each of the plurality of amplification units comprises:
a second output node;
a transistor coupled between at least one of the first voltage source and the second voltage source, and the second output node.

10. The differential amplifier of claim 9, wherein each of the plurality of amplification units further comprises:
one or more circuit elements coupled between a gate terminal of the transistor and the second output node.

11. The differential amplifier of claim 10, wherein the one or more circuit elements comprise a resistor and a capacitor coupled in series between the gate terminal of the transistor and the second output node.

12. The differential amplifier of claim 4, wherein the differential voltage amplifier prevents or reduces an effect caused by one or more single event transient (SET) particles incident upon one or more of the plurality of amplification units.

13. A device for amplifying a differential voltage signal, the device comprising:
means for receiving, by each of a plurality of amplification units, a differential voltage signal comprising a first component and a second component;
means for determining, by each of the plurality of amplification units, a difference between the first component and the second component of the differential voltage signal;
means for amplifying, by each of the plurality of amplification units, the difference between the first component and the second component of the differential voltage signal to generate a plurality of amplified difference signals that each correspond to the amplified difference, wherein at least two of the plurality of amplification units comprises a first amplification circuit, a second amplification circuit, and a driver unit, and wherein the driver unit is configured to receive a first output of the first amplification circuit and a second output of the second amplification circuit, and combine the first output and second output as an amplified difference signal;
means for combining the plurality of amplified difference signals to generate a common output signal that corresponds to the amplified difference; and
means for outputting the common output signal.

14. The device of claim 13, wherein the first amplification circuit and the second amplification circuit each receives the first component and the second component of the differential voltage signal, determines the difference between the first component and the second component, and amplifies the difference to generate one of the respective first output and second output.

15. The device of claim 13, wherein the means for combining the plurality of amplified difference signals to generate the common output signal comprises a common output node.

16. The device of claim 13, wherein the device prevents or reduces an effect caused by one or more single event transient (SET) particles incident upon one or more of the plurality of amplification units.

17. A differential amplifier comprising:
a first voltage source;
a second voltage source;
an amplification module including a plurality of amplification units configured to amplify a difference between a first component and a second component of a differential voltage signal to generate a plurality of amplified difference signals that each correspond to the amplified difference, wherein at least two of the plurality of amplification units comprises:
an output node;
a transistor coupled between at least one of the first voltage source and the second voltage source, and the output node, and
one or more circuit elements coupled between a gate terminal of the transistor and the output node; and
a combination module configured to combine the plurality of amplified difference signals to generate a common output signal that corresponds to the amplified difference.

18. The differential amplifier of claim 17, wherein the one or more circuit elements comprise a resistor and a capacitor coupled in series between the gate terminal of the transistor and the output node.

* * * * *